US008278986B2

(12) United States Patent  
Bettini et al.

(10) Patent No.: US 8,278,986 B2
(45) Date of Patent: Oct. 2, 2012

(54) TRIMMING OF A PSEUDO-CLOSED LOOP PROGRAMMABLE DELAY LINE

(75) Inventors: Luca Bettini, Zurich (CH); Guido De Sandre, Brugherio (IT)

(73) Assignee: STMicroelectronics S.r.l., Agrate Brianza (IT)

(*) Notice: Subject to any disclaimer, the term of this patent is extended or adjusted under 35 U.S.C. 154(b) by 70 days.

(21) Appl. No.: 12/977,093

(22) Filed: Dec. 23, 2010

(65) Prior Publication Data

US 2011/0156785 A1 Jun. 30, 2011

(30) Foreign Application Priority Data

Dec. 30, 2009 (IT) .............. MI2009A2358

(51) Int. Cl.
*H03L 7/00* (2006.01)
(52) U.S. Cl. ......... 327/161; 327/158; 327/263; 327/170
(58) Field of Classification Search .......... None
See application file for complete search history.

(56) References Cited

U.S. PATENT DOCUMENTS

| | | | |
|---|---|---|---|
| 5,336,940 A * | 8/1994 | Sorrells et al. | 327/276 |
| 5,650,739 A | 7/1997 | Hui et al. | |
| 6,748,549 B1 * | 6/2004 | Chao et al. | 713/401 |
| 7,084,682 B2 * | 8/2006 | Jeon et al. | 327/158 |
| 7,336,112 B1 * | 2/2008 | Sha et al. | 327/158 |
| 7,872,494 B2 * | 1/2011 | Welker et al. | 326/30 |
| 2003/0179842 A1 | 9/2003 | Kane et al. | |
| 2005/0189974 A1 * | 9/2005 | Chao | 327/158 |
| 2009/0267668 A1 | 10/2009 | Lin | |

FOREIGN PATENT DOCUMENTS

| | | |
|---|---|---|
| EP | 1039637 | 9/2000 |
| WO | 02095943 | 11/2002 |

OTHER PUBLICATIONS

Search Report for Italian Application No. MI20092358, Ministero dello Sviluppo Economico, May 26, 2011, pp. 3.

\* cited by examiner

*Primary Examiner* — An Luu
(74) *Attorney, Agent, or Firm* — Graybeal Jackson LLP

(57) ABSTRACT

An embodiment is proposed for trimming a programmable delay line in an integrated device, which delay line is adapted to delay an input signal being synchronous with a synchronization signal of the integrated device—by a total delay. An embodiment of a corresponding method includes the steps of: preliminary programming the delay line to provide a selected nominal value of the total delay equal to a period of the timing signal, and trimming the delay line to vary an actual value of the total delay until the actual value of the total delay matches the period of the synchronization signal.

43 Claims, 8 Drawing Sheets

TRIMMING OF A PSEUDO-CLOSED LOOP PROGRAMMABLE DELAY LINE

PRIORITY CLAIM

The instant application claims priority to Italian Patent Application No. MI2009A002358, filed Dec. 30, 2009, which application is incorporated herein by reference in its entirety

TECHNICAL FIELD

An embodiment relates to the field of integrated devices. More specifically, an embodiment relates to the field of delay lines.

BACKGROUND

Integrated devices, and especially memories, are usually synchronized by a master clock signal. However, very often these integrated devices also require signals that are phase-shifted with respect to each other by a value less than a period of the clock signal; for example, these signals are used during data latching operations, bit line pre-charge operations for reading stored data, and the like.

Usually, the signals are phase-shifted directly within each integrated device (in technical jargon, on-chip); for this purpose, the integrated device is provided with one or more delay lines, each one applying a corresponding delay to an input signal (synchronous with the clock signal), so as to obtain a signal being delayed by this delay. Furthermore, to increase the flexibility of the integrated device, the delay lines are generally programmable, so that a target value of the delay may be set at will.

The delay lines are affected, however, by errors due to a number of reasons—such as an intrinsic variability of a manufacturing process of the integrated device, a change of the operating temperature of the integrated device, a drift of the characteristics of the integrated device, noise afflicting the integrated device, and the like. Said errors may cause substantial variations in the actual value of the delay being applied by each delay line with respect to a nominal value thereof (and hence in the corresponding delayed signals being emitted by it); for example, the actual value of the total delay may be up to 5 times larger than its nominal value.

It is, therefore, clear the need for trimming techniques of the delay lines to improve the accuracy of the delay applied by them; for example, the trimming of a delay line based on the discharge of a capacitor (previously loaded at a predefined voltage) may be obtained by appropriately varying the current used to discharge the capacitor.

A simple known trimming technique is of the open loop type; in this case, a trimming procedure is preliminary performed (e.g., in factory) by measuring the actual value of the delay (set to its target value) and trimming the delay line so that it equals its nominal value.

This technique, however, allows a correction of the static component only of the errors of the delay line (e.g., caused by the variability of the manufacturing process), but it may be completely ineffective with respect to a dynamic component thereof (e.g., caused by the temperature change and the characteristics drift).

A more complex known technique is, instead, of the closed loop type being based on a delay-locked loop (or DLL). In this case, there is used a feedback system comprising a phase detector that continuously measures a phase difference between the clock signal and a control signal, which is derived from the delayed signal (with the target value of the delay) in such a way to have a delay equal to an integer number of periods of the clock signal. The phase detector then trims the delay line according to a phase difference between the clock signal and the control signal, to obtain a locking condition in which these signals are in phase with each other (and thus the delayed signal actually has the target value of the delay).

This technique, however, is particularly expensive in terms of energy consumption, since the DLL should be kept always active because of the time required for reaching the locking condition (without which the delay line cannot be used). This disadvantage is particularly acute in integrated devices that require low power consumption (for example, in portable applications).

In addition, in some applications (e.g., non-volatile memories), the delay to be generated on-chip does not need to be extremely accurate (e.g., 500 ps accuracy over a delay of tens of nanoseconds may be sufficiently accurate); therefore, in such an application, a closed-loop solution may be too costly, while an open loop solution may not be accurate enough.

SUMMARY

In general terms, an embodiment is based on the idea of creating a control of a pseudo-closed loop type.

More specifically, an embodiment is a method for trimming a programmable delay line in an integrated device, which delay line is adapted to delay an input signal—synchronous with a synchronization signal of the integrated device—by a total delay. The method includes the step of preliminary programming the delay line to provide a selected nominal value of the total delay, which is equal to a period of the synchronization signal. The method further includes the step of trimming the delay line to vary an actual value of the total delay, until the actual value of the total delay matches the period of the synchronization signal.

Another embodiment is a corresponding integrated device.

A further embodiment is a complex system that includes one or more of these integrated devices.

BRIEF DESCRIPTION OF THE DRAWINGS

One or more embodiments, as well as features and advantages thereof, will be better understood with reference to the following detailed description, given purely by way of a non-restrictive indication and without limitation, to be read in conjunction with the attached figures. In this respect, it is expressly understood that the figures are not necessarily drawn to scale and that, unless otherwise specified, they are simply intended to conceptually illustrate the structures and procedures described herein. In particular.

DETAILED DESCRIPTION

Figure 1:
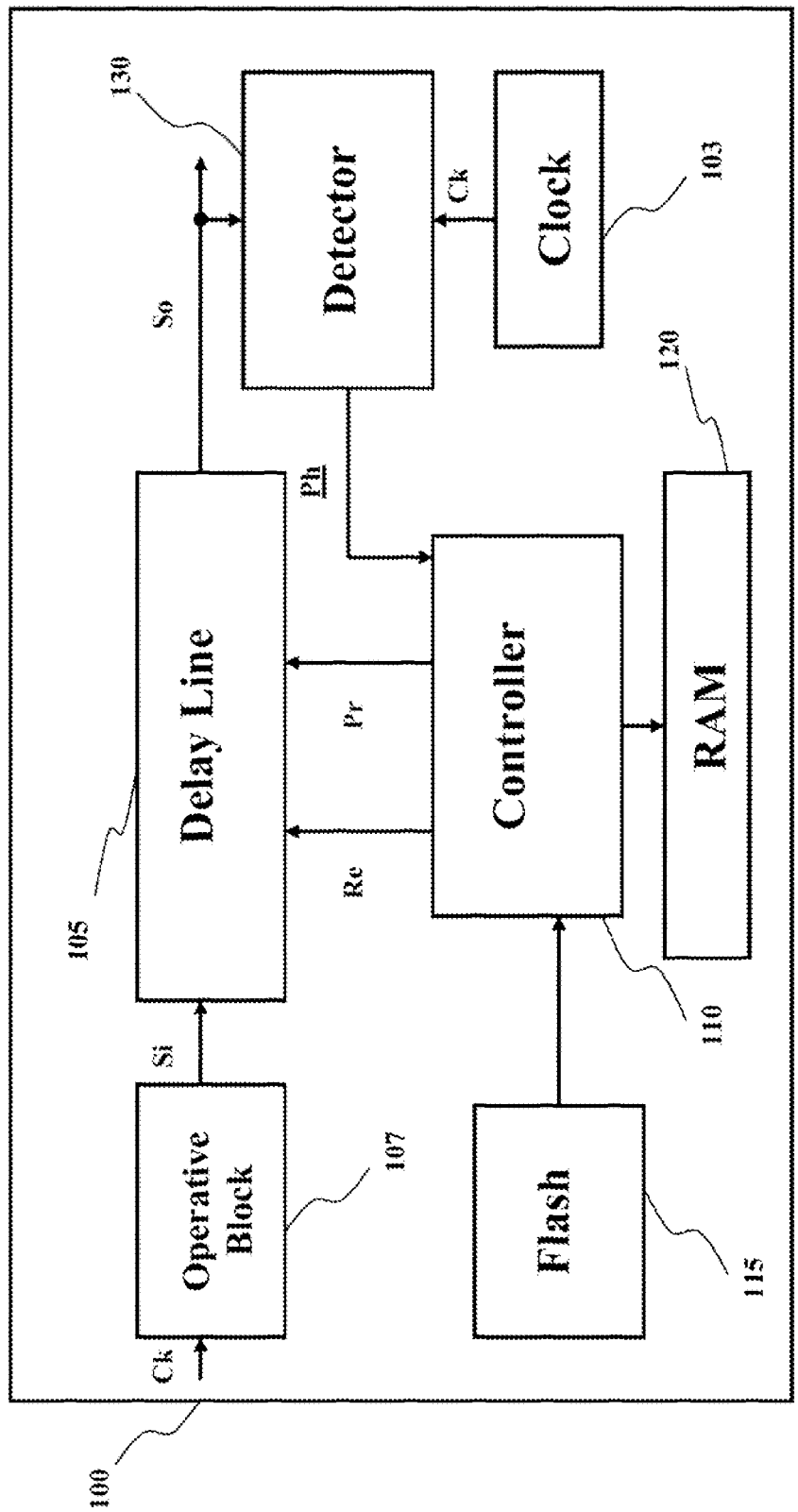
FIG. 1 shows an integrated device that may be used to implement an embodiment.

Referring in particular to FIG. 1, there is shown an integrated device 100 that may be used to implement an embodiment (e.g., a memory device).

The integrated device 100 comprises a system clock 103, which generates a clock signal Ck that is used to synchronize the operation of the entire integrated device 100. The clock signal Ck is a periodic signal, which has a predetermined period T (e.g., 100 ns); this clock signal Ck (e.g., obtained through a quartz oscillator) is very accurate, so that its period T may be considered stable in all operating conditions of the integrated device 100.

The integrated device 100 further comprises a programmable delay line 105 (in addition to its various functional blocks not relevant to this description, and therefore not shown in the figure). The delay line 105 receives an input signal Si from an operative block 107. The operative block 107 generates the input signal Si to be synchronous with the clock signal Ck (received from the system clock 103); for example, the input signal Si includes a pulse (either periodic or not), which begins with a rising edge of the clock signal Ck. The delay line 105 emits a (total) output signal So, which is identical to the input signal but it is delayed by a total delay Dt (usually different from the period T of the clock signal Ck).

The integrated device 100 further comprises a controller 110 for trimming and programming the delay line 105 (as described in detail below). The controller 110 operates according to a plurality of instructions stored in a non-volatile memory 115 (e.g., a memory of flash type), and it uses a volatile memory 120 (e.g., a RAM) as working memory.

More specifically, the controller 110 is used to program the delay line 105 via a programming signal Pr, in order to achieve a desired target value of the total delay Dt (for example, indicated in a variable contained in the non-volatile memory 115). The controller 110 is also used to trim the delay line 105 via a trimming signal Re, in order to compensate for errors that affect an actual value of the total delay Dt with respect to its nominal value (e.g., due to the variability of manufacturing process, a change of the operating temperature, a drift of the characteristics of the integrated device, a noise, and the like).

For this purpose, in an embodiment, the controller 110—during a trimming process of the delay line 105 (for example, performed at the integrated device 100 start-up or periodically, as described in detail below)—preliminary programs the delay line 105 so that the nominal value of the total delay Dt is equal to the period T of the clock signal Ck. The controller 110 also interfaces with a detector 130, which receives as an input the output signal So (from the delay line 105) and the clock signal Ck (from the system clock 103); the detector 130 provides the controller 110 with a comparison signal Ph, which is asserted when the total delay Dt of the output signal So is substantially equal to the period T of the clock signal Ck (for example, as soon as the total delay Dt exceeds the period T)—the comparison signal Ph is underlined to indicate it is at a low logic value or 0 (e.g., equal to a reference voltage or ground) when asserted, and it is at a high logic value or 1 (e.g., equal to a supply voltage) when deasserted. The controller 110 trims the delay line 105 via the trimming signal Re to vary the total delay Dt until the comparison signal Ph is asserted (so that the actual value of the total delay Dt is substantially equal to the period T of the clock signal Ck). At this point, in an embodiment it is possible to operatively program the delay line 105 in order to obtain the target value of the total delay Dt exactly.

An embodiment implements a pseudo-closed loop technique, which achieves the advantages of both an open loop technique and a closed loop technique, but without corresponding disadvantages. In fact, in such a way both a static component of the errors (e.g., caused by the variability of the manufacturing process) and a dynamic component thereof (e.g., caused by temperature changes and characteristics drift) may be corrected. At the same time, an embodiment requires reduced energy consumption—because the process is performed only sporadically, so that the controller 110 and the detector 130 do not require a continuous operation. This is particularly advantageous in specific applications (for example, when the integrated circuit 100 is used in mobile devices). Moreover, in this way it is possible to achieve a level of accuracy of the delay line 105 being acceptable in many practical situations (for example, at relatively low frequency).

Figure 2:
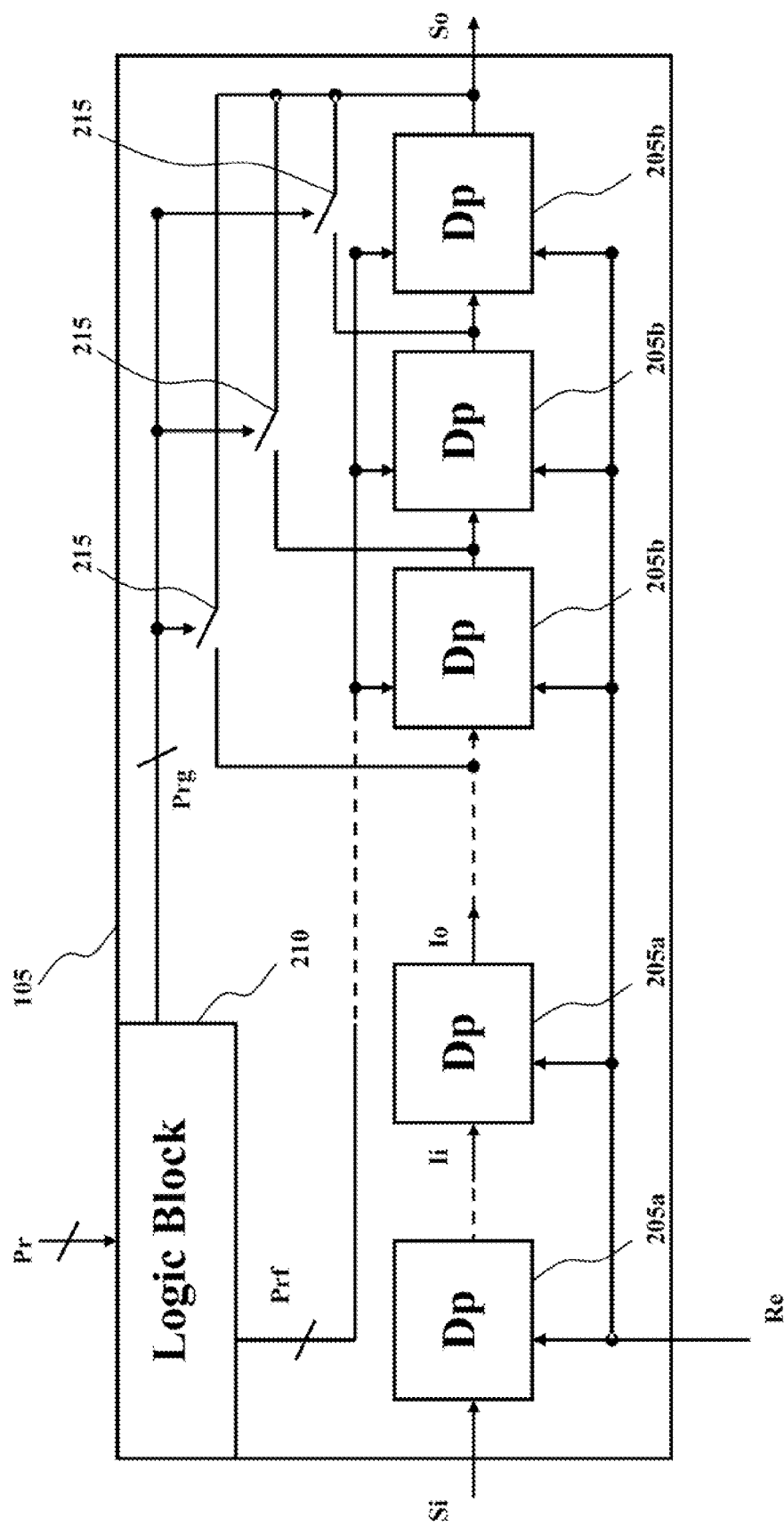
FIG. 2 shows a structure of a delay line to which an embodiment may be applied.

FIG. 2 illustrates the structure of the delay line 105 to which an embodiment may be applied.

The delay line 105 comprises a series of delay modules 205a, 205b, (e.g., 20-100 modules). The delay modules 205a, 205b are coupled in series (with all the delay modules 205a at the beginning and all the delay modules 205b at the end of the delay line 105), so that each delay module 205a, 205b receives a (partial) input signal Ii equal to the (partial) output signal of a preceding delay module 205a, 205b (with the input signal Ii of a first delay module 205a that is equal to the input signal Si of the delay line 105, and the output signal Io of a last delay module 205b that is equal to the output signal So of the delay line 105); each output signal Io is identical to the corresponding input signal Ii, but delayed by a corresponding partial delay Dp. The delay line 105 also comprises a logic block 210, whose input is the programming signal Pr and, according to the latter, generates a set of coarse programming signals Prg and a set of fine programming signals Prf.

In particular, the delay modules 205a (for example, in a number Na=10-50) are always enabled. The delay modules 205b (for example, in a number Nb=10-50) may be selectively disabled; for this purpose, the delay line 105 comprises an equal number of switches 215 (only three shown in the figure for representation simplicity). Each switch 215 (when closed) short-circuits a corresponding increasing number of delay modules 205b (i.e., a last delay module 205b, the last two delay modules 205b, and the last three delay modules 205b in the figure). Each switch 215 is controlled by a corresponding coarse programming signal Prg.

The partial delay Dp of each delay module 205a is fixed to a unitary delay Δd (for example, with a nominal value of 1-5 ns)—so that it will be differentiated in the following as fixed delay module 205a. Each delay module 205b is instead individually programmable, so that the corresponding partial delay Dp may be set to the unitary delay Δd or to a multiple of a fractional delay, equal to a predetermined fraction of the unitary delay Δd (e.g., Δd/4)—so that it will be differentiated in the following as programmable delay module 205b; the setting of the partial delay Dp of each delay module 205b (e.g., to the value Δd/4, Δd/2, 3Δ/4, or Δd) is controlled by a corresponding fine programming signal Prf. In particular, the fine programming of the partial delay Dp to a multiple of the fractional delay e.g., Δd/4 is executed solely on a last delay module 205b among those being not disabled, in order to achieve the target value of the total delay Dt with a precision equal to the fractional delay e.g., $\Delta d/4$ (while the remaining delay modules 205b that are enabled will always be programmed to provide the unitary delay $\Delta d$).

Therefore, the total delay Dt is equal to the sum of the partial delays Dp of the delay modules 205a, 205b being enabled (i.e., the delay modules 205a always enabled and the delay modules 205b not disabled). In this way, the delay line 105 may be programmed to achieve the target value of the total delay Dt with a coarse granularity equal to the unitary delay $\Delta d$ (e.g., 2 ns) and a fine granularity equal to a fractional delay e.g., $\Delta d/4$ (e.g., 0.5 ns) by programming the last enabled module 205a, 205b via the corresponding fine programming signal Prf. In particular, the nominal value of the total delay Dt may vary from a minimum value $Na \cdot \Delta d$, where all the delay modules 205b are disabled, to a maximum value of $(Na+Nb) \cdot \Delta d$, when all the delay modules 205b are enabled and the partial delay Dp of the last delay module 205b is programmed to the unitary delay $\Delta d$ (between which minimum and maximum value the period T of the clock signal Ck should be included to allow the execution of the trimming cycle mentioned above). For example, when the delay line 105 comprises 25 delay modules 205a and 25 delay modules 205b (with unitary delay $\Delta d=2$ ns), the nominal value of the total delay may vary from the minimum value $25 \cdot 2=50$ ns to the maximum value $50 \cdot 2=100$ ns.

Additionally, all the delay modules 205a, 205b receive the same trimming signal Re (being input to the delay line 105) so as to be trimmed in a uniform manner to obtain the actual value of the unitary delay $\Delta d$, and thus the fractional delay e.g., $\Delta d/4$, equal to the corresponding nominal value. In particular, during the trimming process, once the delay line 105 has been programmed to obtain the nominal value of the total delay Dt equal to the period T of the clock signal Ck, the trimming signal Re may vary the total delay Dt from an actual value definitely lower to an actual value definitely greater than the period T of the clock signal Ck.

Figure 3A:
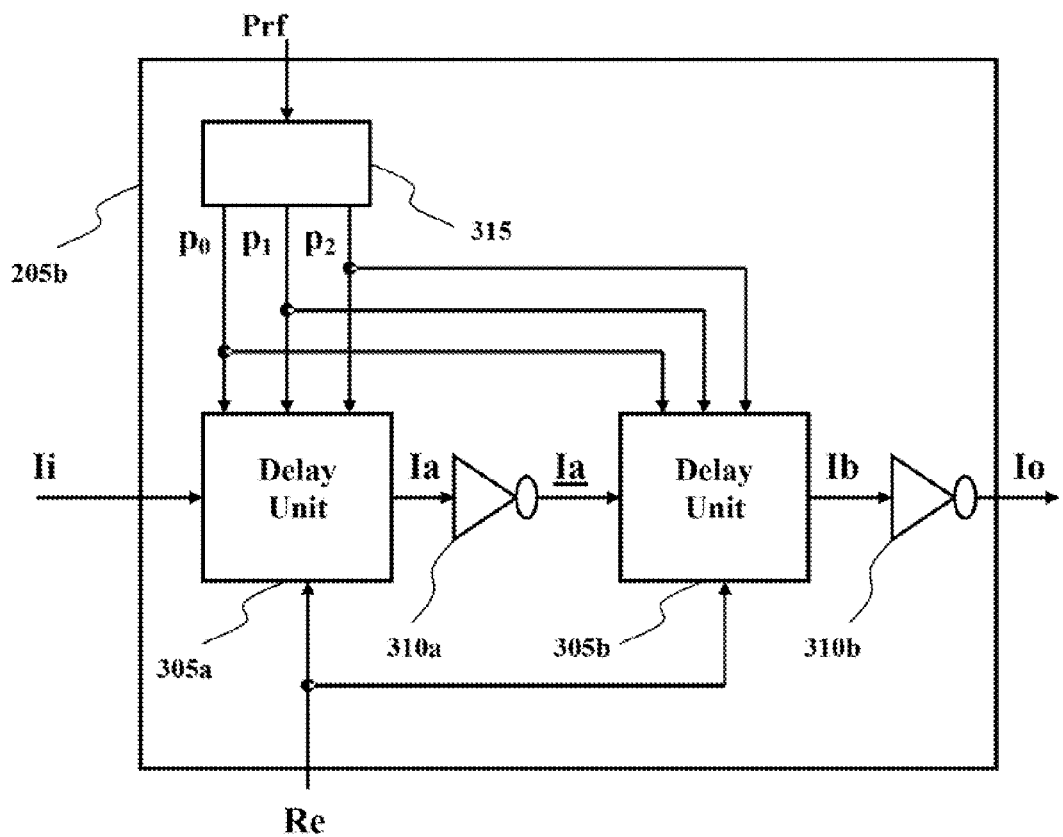
FIG. 3A shows the structure of an embodiment of a delay module of the delay line.

FIG. 3A shows the structure of an embodiment of a single (programmable) delay module 205b. The delay module 205b comprises two delay units 305a and 305b identical. The delay unit 305a receives the input signal Ii of the delay module 205b, and generates an intermediate output signal Ia identical to the input signal Ii being delayed by the partial delay Dp on every falling edge thereof. The intermediate signal Ia is then provided to an inverter 310a, which in turn provides a negated intermediate signal Ia as input to the delay unit 305b. The delay unit 305b generates a further intermediate output signal Ib identical to the negated intermediate signal Ia being delayed by the same partial delay Dp on every falling edge thereof. The intermediate signal Ib is then provided to a further inverter 310b, which generates the output signal Io of the delay module 205b (equal to the negated intermediate signal Ib).

The delay module 205b also comprises a decoder 315, which receives the corresponding fine programming signals Prf (for example, 2 bits). The decoder 315 outputs three internal programming signals $p_0$, $p_1$ and $p_2$, which represent those fine programming signals in thermometric code; for example, when the fine programming signal Prf has the value 00, 01, 10 and 11 (e.g., to set the partial delay Dp to $\Delta d/4$, $\Delta d/2$, $3\Delta d/4$, and $4\Delta d/4=\Delta d$, respectively), the internal programming signals $p_0$, $p_1$, $p_2$ take the values 000, 001, 011, and 111, respectively.

Both the delay units 305a, 305b receive the internal programming signals $p_0$, $p_1$, $p_2$ (for programming the partial delay Dp); moreover, both the delay units 305a, 305b also receive the trimming signal Re (for trimming the partial delay Dp).

Figure 3B:
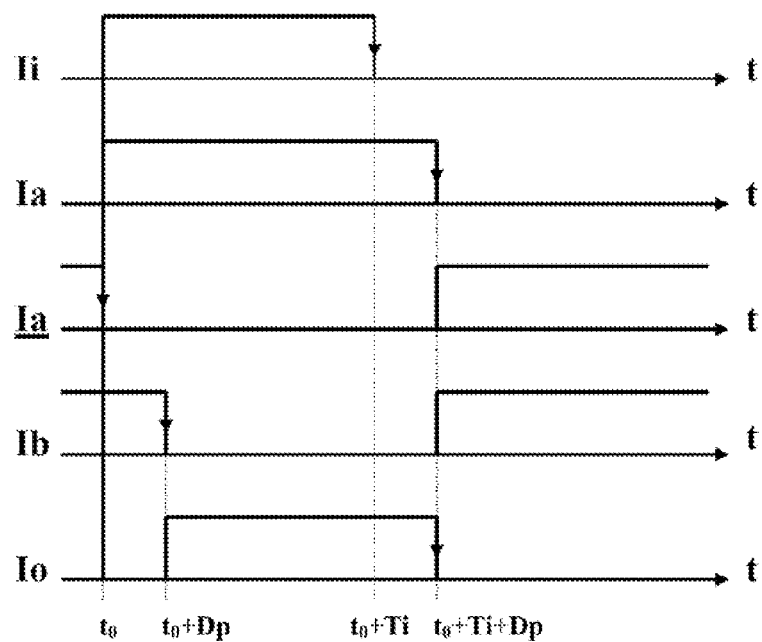
FIG. 3B shows various waveforms relating to an embodiment of the delay module of FIG. 3A.

With reference now to FIG. 3B in conjunction with FIG. 3A, there are shown the waveforms of the signals Ii, Ia, Ia, Ib, and Io of an embodiment of the delay module 205b. As it can be seen, the input signal Ii has a rising edge at a time $t_0$, a falling edge after an interval Ti (i.e., at the time $t_0+Ti$). The intermediate signal Ia shows a rising edge at the same instant $t_0$, with a falling edge after the interval Ti plus the partial delay Dp (i.e., at the time $t_0+Ti+Dp$). In contrast, the negated intermediate signal Ia shows a falling edge at the time $t_0$, with a rising edge at the time $t_0+Ti+Dp$. In turn, the intermediate signal Ib shows a falling edge at the time $t_0$ plus the partial delay Dp (i.e., at the time $t_0+Dp$), with a rising edge at the same time $t_0+Ti+Dp$. Therefore, the output signal Io (equal to the negated intermediate signal Ib) on the contrary shows a rising edge at the time $t_0+Dp$, with a falling edge at the time $t_0+Ti+Dp$. In this way, in an embodiment, the output signal Io is identical to the signal Ii, but delayed by the partial delay Dp as desired.

Any non-programmable delay module 205a may have a structure and operation completely identical to those described above, with the exception that it does not include any decoder (and it does not receive any fine programming signal).

FIG. 4 now illustrates an electronic circuit that may implements any one of the delay units of a programmable delay module (generically indicated with the reference 305).

The input signal to the delay unit 305 (generically indicated with the reference I) is provided to a control terminal (gate) of a PMOS transistor 405 and to the input of a NOT gate 410. The NOT gate 410 outputs the negated input signal I, which is supplied to a gate terminal of a further PMOS transistor 415 and to a gate terminal of an NMOS transistor 420.

A source terminal of a transistor 415 is coupled to a terminal that provides the power supply voltage Vcc to the integrated circuit. A drain terminal of the transistor 415 is coupled to a source terminal of the transistor 405 and to a drain terminal of the transistor 420. A drain terminal of an NMOS transistor 425 is coupled to a drain terminal of the transistor 405 and to a source terminal of the transistor 420. A source terminal of the transistor 425 is coupled to a ground terminal. The trimming signal Re commands a gate terminal of the transistor 425.

The delay unit 305 comprises a fixed capacitive branch, which is formed by a capacitor 430 coupled between the drain terminal of the transistor 415 and the ground terminal. The delay unit 305 further comprises three excludable capacitive branches $435_0$, $435_1$ and $435_2$; each excludable capacitive branch $435_0$, $435_1$, $435_2$ comprises an NMOS transistor $440_0$, $440_1$, $440_2$ and a capacitor $445_0$, $445_1$, $445_2$, interconnected through a source terminal of the transistor $440_0$, $440_1$, $440_2$ and a first terminal of the capacitor $445_0$, $445_1$, $445_2$. Each excludable capacitive branch $435_0$, $435_1$, $435_2$ is coupled to the drain terminal of the transistor 415 through a drain terminal of the transistor $440_0$, $440_1$, $440_2$, and to the ground terminal through a second terminal of the capacitor $445_0$, $445_1$, $445_2$. A gate terminal of the transistor $440_0$, $440_1$ and $440_2$ of each excludable capacitive branch $435_0$, $435_1$ and $435_2$ is controlled by the corresponding internal programming signal $p_0$, $p_1$ and $p_2$. All the capacitors 430, $445_0$, $445_1$ and $445_2$ have nominally the same capacitance C in an embodiment.

A buffer 450 has an input terminal coupled to the drain terminal of the transistor 415 to receive an internal signal V, and an output terminal providing a corresponding intermediate signal (generically indicated with the reference I').

Figure 4A:
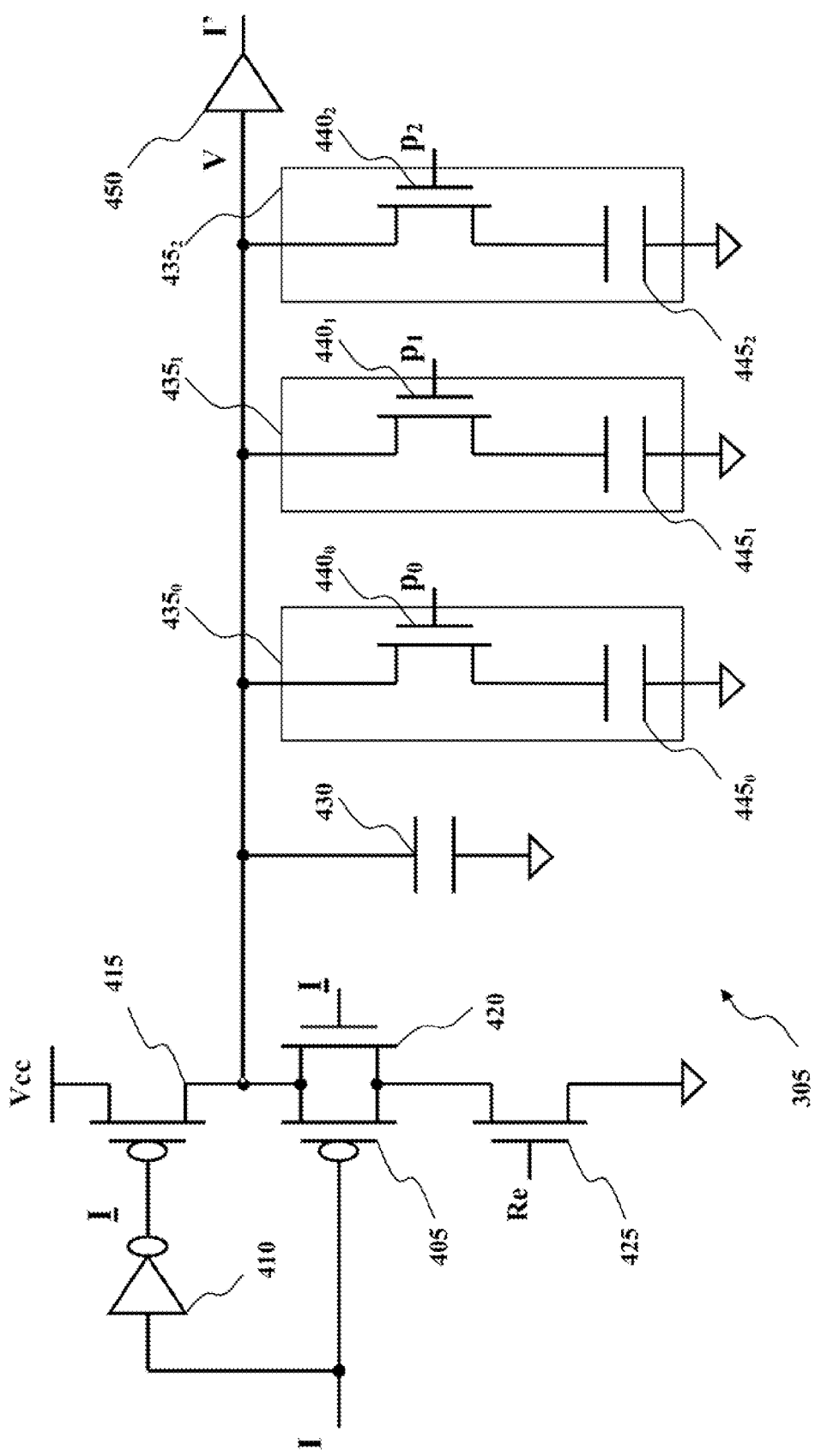
FIG. 4A shows an electronic circuit that implements an embodiment of a delay unit of this delay module.
Figure 4B:
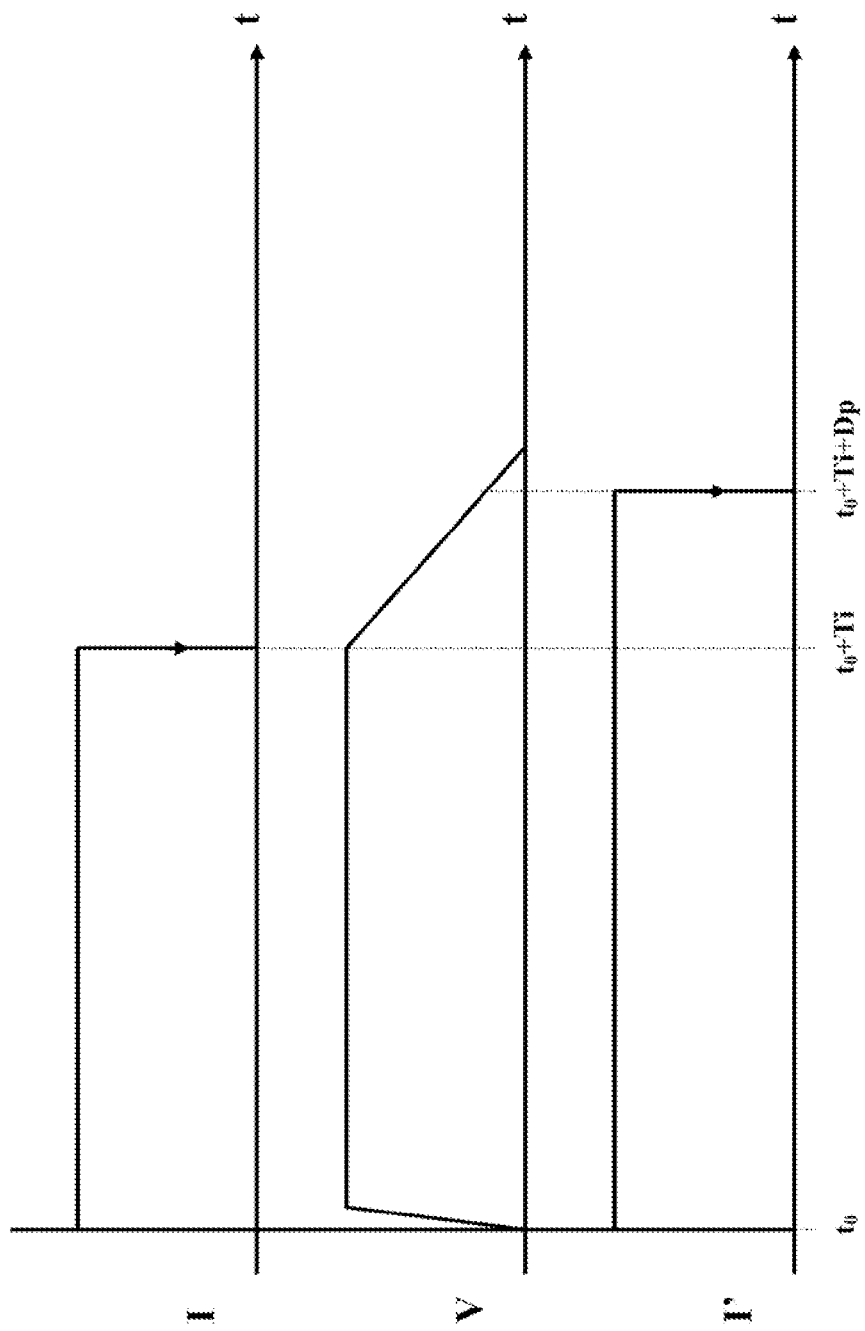
FIG. 4B shows various waveforms relating to an embodiment of the delay unit of FIG. 4A.

With reference now to FIG. 4B in conjunction with FIG. 4A, there are shown the waveforms of the signals I, V and I' of the delay unit 305.

The internal programming signals $p_0$, $p_1$ and $p_2$ are used to control the corresponding excludable capacitive branches $435_0$, $435_1$ and $435_2$. In particular, when each internal programming signal $p_0$, $p_1$ and $p_2$ is at the logic value 0, the transistor $440_0$, $440_1$, $440_2$ is off, so that the capacitor $445_0$, $445_1$, $445_2$ is isolated from the input terminal of the buffer 450; on the contrary, when each internal programming signal $p_0$, $p_1$ and $p_2$ is at the logic value 1, the transistor $440_0$, $440_1$, $440_2$ is on, so that the capacitor $445_0$, $445_1$, $445_2$ is coupled to the input terminal of the buffer 450. Thus, the total capacitance at the input terminal of the buffer 450 is equal to the sum of the capacitance of the capacitor 430 (always coupled) and the capacitance of each capacitor $445_0$, $445_1$, $445_2$ not excluded, as they are coupled together in parallel. In this way, it is possible to vary the capacitance from a minimum value C to a maximum value 4C according to the internal programming signals $p_0$, $p_1$, $p_2$ (e.g., equal to C for the value 000, equal to 2C for the value 001, equal to 3C for the value 011, and equal to 4C for the value 111).

When the signal I switches to the logic value 1 at its rising edge at the time $t_0$, the transistor 415 is turned on and the transistors 405 and 420 are turned off; in this condition, the capacitor 430 and each capacitor $445_0$, $445_1$ and $445_2$ not excluded are loaded to the supply voltage. Therefore, the internal signal V reaches the supply voltage very fast (with a negligible charging time); the intermediate signal I' then switches to the logic value 1 approximately at the same time.

At this point, when the signal I switches to the logic value 0 at its falling edge at the time $t_0+Ti$, the transistors 405 and 420 are turned on while the transistor 415 is turned off, in this condition, the capacitor 430 and each capacitor $445_0$, $445_1$ and $445_2$ not excluded are discharged to the ground voltage via a discharge current supplied by the transistor 425 (biased to act as a current source, so as to provide the discharge current with a value depending on the trimming signal Re). Therefore, the internal signal V reaches the ground voltage after a discharge time that is directly proportional to the total capacitance at the input terminal of the buffer 450 (defined by the non-excluded capacitors $445_0$, $445_1$, $445_2$) and inversely proportional to the discharge current (defined by the biasing of the transistor 425); the intermediate signal I' then switches to the logic value 0 as soon as the internal signal V reaches (from the supply voltage) a corresponding threshold value of the buffer 450.

Therefore, the intermediate signal I' will have its rising edge at approximately the same instant $t_0$ of the signal I, and its falling edge after the interval Ti plus this discharge time, which then defines the partial delay Dp of the delay unit 305.

In this way, the partial delay Dp may be programmed by varying the value of the total capacitance (via the internal programming signals $p_0$, $p_1$, $p_2$). In an embodiment, when the value of the total capacity is 4C ($p_0$, $p_1$, $p_2$=111) the discharge time has a maximum value (to define the unitary delay $\Delta d$), when the total capacitance has the value 3C ($p_0$, $p_1$, $p_2$=011) the discharge time has a value equal to the ¾ of the maximum value (3$\Delta d$/4), when the total capacity has the value 2C ($p_0$, $p_1$, $p_2$=001) the discharge time has a value equal to ²⁄₄ of the maximum value (2$\Delta d$/4), and when the total capacity has the value C ($p_0$, $p_1$, $p_2$=000) the discharge time has a value equal to ¼ of the maximum value ($\Delta d$/4).

The partial delay Dp may also be trimmed by varying the discharge current provided by the transistor 425 (via the trimming signal Re). In particular, the partial delay Dp (programmed between $\Delta d/4$ and $\Delta d$) may be varied between a maximum value (when the discharge current is minimum) and a minimum value (when the discharge current is maximum).

Each delay unit of the non-programmable delay module may have a structure and operation completely identical to those described above, the only difference being that all of its capacitive branches are fixed, with no associated transistor (and it does not receive any fine programming signal).

Figure 5A:
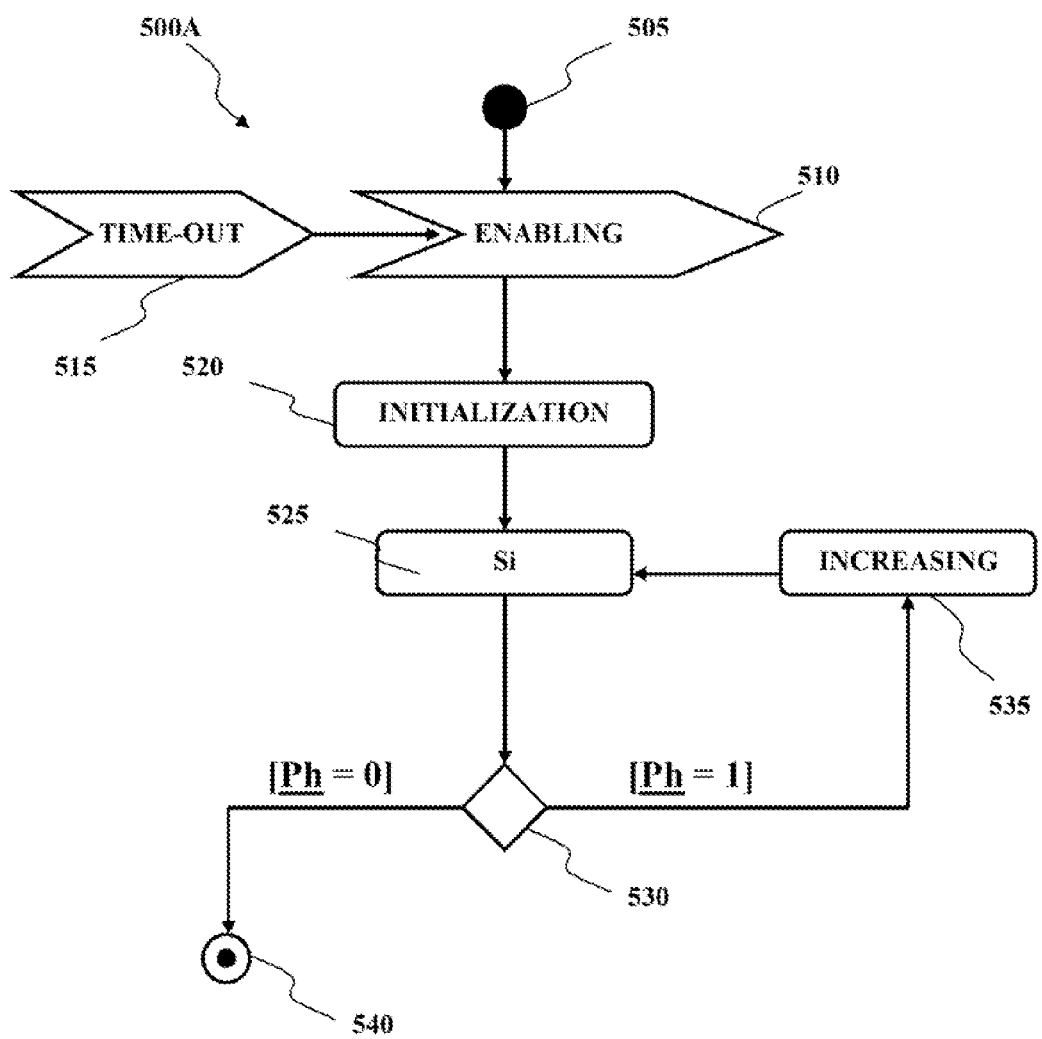
FIG. 5A shows an activity diagram relating to a trimming process of the delay line according to an embodiment.

FIG. 5A shows a flow diagram relating to a trimming procedure of the delay line according to an embodiment.

A corresponding method 500A begins at the black start circle 505 (at each turn-on of the integrated device 100), and then proceeds to the block 510; in addition or in the alternative, the same point is also reached periodically from the block 515 at the expiring of a corresponding time-out—for example, every 1-10 min. At this point, the delay line is programmed (via the programming signal Pr, as described in detail below) so that the nominal value of total delay Dt is equal to the period T of the clock signal.

The activity flow then proceeds to the block 520, where the delay line is initialized by trimming the actual value of the total delay Dt (via the trimming signal Re) so that it is certainly less than the period T of the clock signal in any operative conditions (e.g., by setting the discharge current of the various delay units to its maximum value).

A loop is then started at the block 525, where the input signal is supplied to the delay line. The method then verifies at the block 530 whether the actual value of the total delay Dt is greater than the period T of the clock signal Ck (as indicated by the comparison signal Ph). If not (comparison signal Ph being deasserted at the logic value 1), the method 500A passes to the block 535, where the total delay Dt is increased. This result is achieved by varying the control signal Re by a predefined step, so as to correspondingly reduce the discharge current of the various delay units; consequently, the partial delay Dp of each delay module is increased by a same fraction thereof and thus the total delay Dt is increased in proportion to the number of the enabled delay modules). The flow diagram then returns to the block 525 for reiterating the trimming loop. As soon as the total delay Dt exceeds the period T of the clock signal Ck (comparison signal Ph being asserted at the logic value 0) the method 500A ends by passing from the block 530 to the end concentric circles 540.

In this way, it may be ensured that the actual value of the total delay Dt is equal to its nominal value (i.e., the period T of the clock signal), with a difference at most equal to its increasing step during the trimming procedure described above. Consequently (since all the delay modules are equal to each other and possibly linearly programmed, and they are also all trimmed in a uniform manner) it also may be ensured that the actual value of the partial delay Dp of each delay module is equal to its nominal value (from $\Delta d/4$ to $\Delta d$).

Figure 5B:
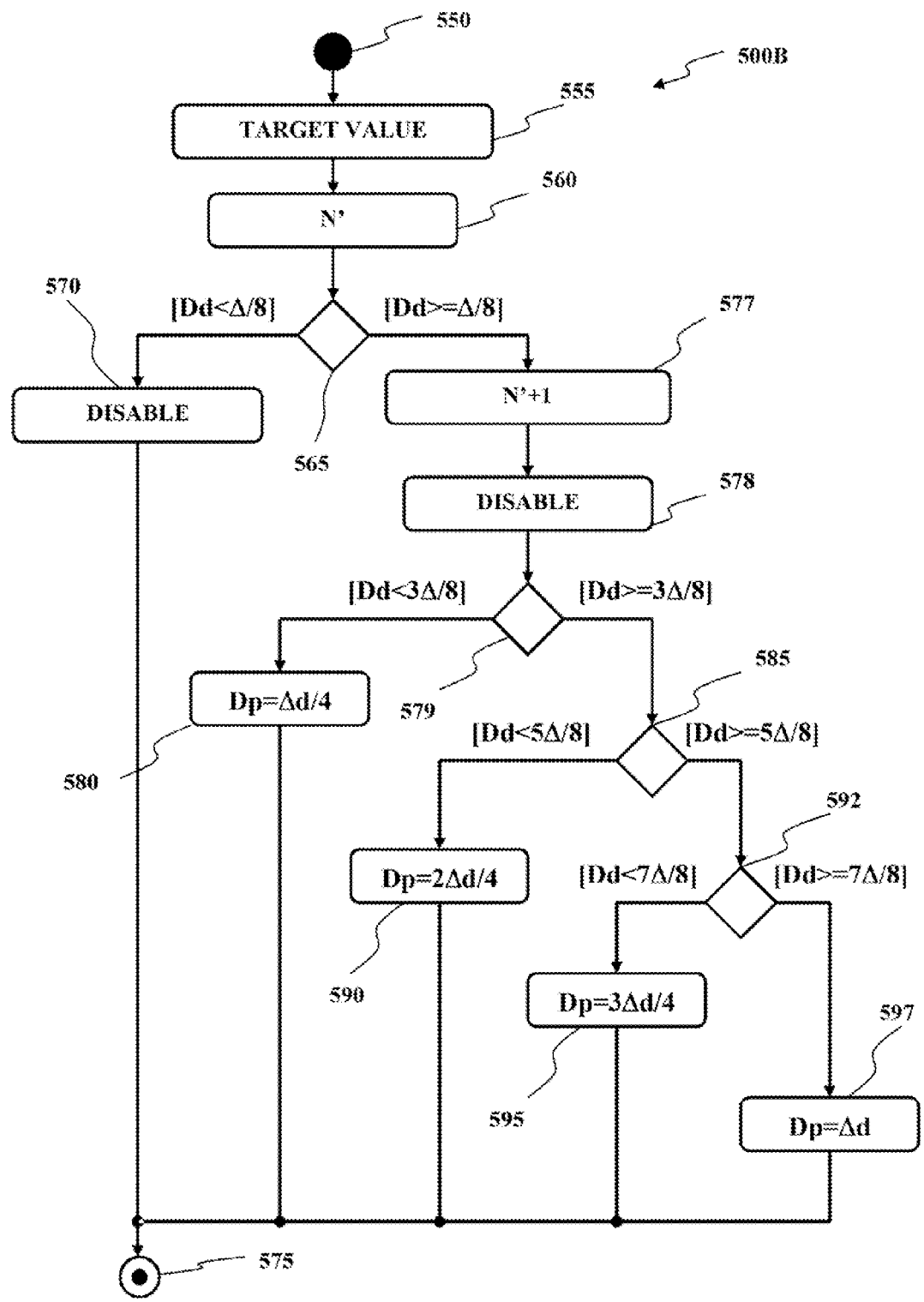
FIG. 5B shows an activity diagram relating to a programming process of the delay line according to an embodiment.

The FIG. 5B illustrates a flow diagram relating to a programming procedure of the delay line according to an embodiment of the disclosure.

A corresponding method 500B begins at the black start circle 550, and then proceeds to the block 555 where is selected the target value of the total delay Dt (e.g., by reading from a variable contained in the non-volatile memory of the controller).

Continuing to the block 560, there is at first performed a coarse programming of the delay line. For this purpose, there is calculated a total number N' of delay modules (each one providing a partial delay Dp equal to the unitary delay $\Delta d$) that are needed to reach the target value of the total delay Dt being rounded down. In particular, indicating with Dt' the target value of the total delay Dt, said total number N' is equal to INT[Dt'/Δd]; for example, a target value 70<=Dt'<72 requires a total number N' of delay modules (with a partial delay Dp=2 ns) equal to INT[Dt'/Δd]=35 (which provide a total delay Dt=35·2=70 ns). At this point, there is calculated the number of programmable delay modules to disable for reaching the total number N' of the delay modules. In particular, this number will be equal to Na+Nb−N'; for example, if the delay line includes Na=25 fixed delay modules and Nb=25 programmable delay modules, the number of programmable delay modules to be disabled to obtain the total number of the delay modules N'=35 will be Na+Nb−N'=25+25−35=15.

At this point, a fine programming of the delay line is performed. For this purpose, a test is performed at the block 565 to verify whether a difference Dd between the target value Dt' and the total delay Dt (provided by the total number N' of the delay modules) is lower than ½ of the fractional delay Δd/4 (i.e., Dd<Δd/8). If so, the method 500B descends to the block 570, where the programmable delay modules are disabled in the number calculated above (at the end of the delay line, by closing the switch associated with them via the corresponding coarse programming signal Prg). The method 500B then terminates at the end concentric circles 575. Indeed, in this condition the total delay Dt cannot be varied to approximate the target value Dt more accurately (since the fine granularity of the delay line is equal to Δd/4). For example, if the target value is 70.00<=Dt'<70.25, the delay line will be programmed to give the total delay Dt=70 ns (by a total number of delay modules N'=35, each one providing a partial delay Dp=2 ns).

Otherwise (i.e., if Dd>=Δd/8), the method 500B moves from the block 565 to the block 577, where the total number of the delay modules N' is increased by one unit, and therefore the number of the programmable delay modules to be disabled is reduced by one. Proceeding to the block 578, the programmable delay modules are disabled in this number (as above, at the end of the delay line by closing the switch being associated with them via the corresponding coarse programming signal Prg).

A test is now performed at the block 579 to verify whether the difference Dd (between the target value Dt' and the total delay Dt provided by the total number of delay modules N'−1) is less than 3/2 of the fractional delay Δd/4 (i.e., Dd<3Δd/8). If so, the method 500B descends to the block 580, where the last enabled delay module is programmed to provide a partial delay Dp=Δd/4 (via the corresponding fine programming signals Prf). The method 500B then terminates to the end concentric circles 575. For example, if the target value is 70.25 ns<=Dd<70.75 ns, the delay line will be programmed to give the total delay Dt=70.5 ns (with a total number of delay modules N'=36, with the first 35 delay modules that provide a partial delay Dp=2 ns and the last delay module that provides a partial delay Dp=0.5 ns).

Otherwise (i.e., if Dd>=3Δd/8), the method 500B moves from the block 579 to the block 585, where a further test is performed to verify whether the difference Dd is less than 5/2 of the fractional delay Δd/4 (i.e., Dd<5Δd/8). If so, the method 500B descends to the block 590, where the last enabled delay module is programmed to provide a partial delay Dp=2Δd/4 (via the corresponding fine programming signal Prf). The method 500B then terminates to the end concentric circles 575. For example, if the target value is 70.75ns<=Dd<71.25 ns, the delay line will be programmed to give the total delay Dt=71.00 ns (with a total number of delay modules N'=36, with the first 35 delay modules that provide a partial delay Dp=2 ns and the last delay module that provides a partial delay Dp=1 ns).

Otherwise (i.e., if Dd>=5Δd/8), the method 500B moves from the block 585 to the block 592, where a further test is performed to verify whether the difference Dd is less than 7/2 of the fractional delay Δd/4 (i.e., Dd<7Δd/8). If so, the method 500B descends to the block 595, where the last enabled delay module is programmed to provide a partial delay Dp=3Δd/4 (via the corresponding fine programming signal Prf). The method 500B then terminates to the end concentric circles 575. For example, if the target value is 71.25 ns<=Dd<71.75 ns, the delay line will be programmed to give the total delay Dt=71.50 ns (with a total number of delay modules N'=36, with the first 35 delay modules that provide a partial delay Dp=2 ns and the last delay module that provides a partial delay Dp=1.5 ns).

Otherwise (i.e., if Dd>=7Δd/8, with necessarily Dd<Δd), the method 500B moves from the block 592 to the block 597, where the last enabled delay module is programmed to provide a partial delay Dp=Δd (via the corresponding fine programming signal Prf). The method 500B then terminates to the end concentric circles 575. For example, if the target value is 71.75 ns<=Dd<72.00 ns, the delay line will be programmed to give the total delay Dt=72.00 ns (with a total number of delay modules N'=36 each one providing a partial delay Dp=2 ns).

Figure 6A:
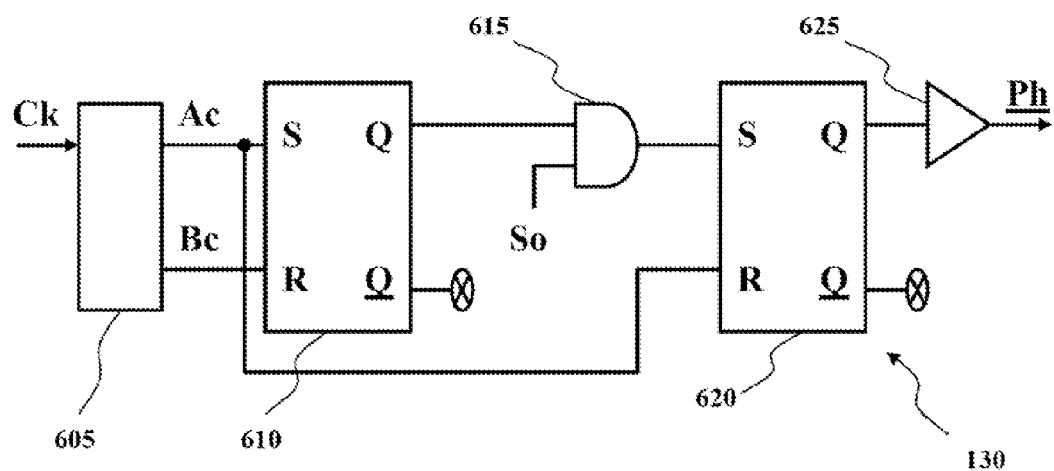
FIG. 6A shows the structure of a detector of the delay line according to an embodiment.

FIG. 6A shows a structure of the detector circuit 130 according to an embodiment.

The clock signal Ck is input to a logic block 605. This logic block 605 generates a signal Ac that consists of a pulse with a short duration at the logical value 1 on the rising edge of the clock signal Ck, and a signal Bc consisting of a pulse with a short duration at the logical value 1 on an immediately subsequent rising edge of the clock signal Ck (after its period T).

The signal Ac is sent to a set input (S) of a flip-flop of the SR type 610, while the signal Bc is supplied to a reset input (R) of the same flip-flop 610. A main output (Q) of the flip-flop 610 is coupled to a first input of an AND gate 615—while the negated output (Q) of the flip-flop 610 is not used. The AND gate 615 receives the output signal So of the delay line 105 at its second input. An output of the AND gate 615 is coupled to a set input of another flip-flop of the SR type 620. At a reset input of said flip-flop 620 there is instead provided the signal Ac. A main output of the flip-flop 620 is coupled to an input of a buffer 625 (while a negated output of the flip-flop 620 is not used). An output of said buffer 625 provides the comparison signal Ph.

Figure 6B:
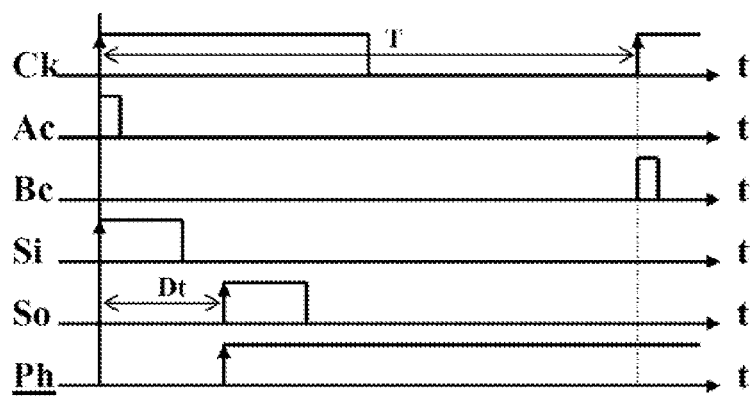
FIGS. 6B-6C show a set of waveforms relating to an embodiment of the detector of FIG. 6A.
Figure 6C:
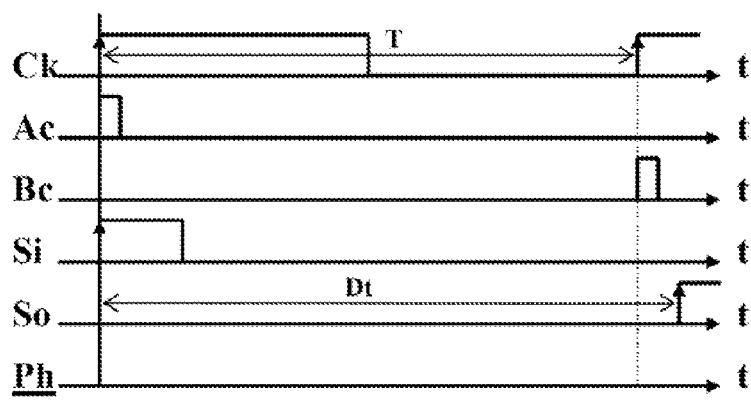

With reference now to FIGS. 6B-6C in conjunction with FIG. 6A, there are shown the waveforms of the signals Ck, Ac, Bc, Si, So and Ph of the detector 130.

In particular, the FIG. 6B illustrates an initial stage of the trimming process described above, where the total delay Dt is still shorter than the period T of the clock signal Ck.

In this condition, at a first rising edge of the clock signal Ck the corresponding pulse at the logic value 1 of the signal Ac sets the flip-flop 610, so that its main output reaches the logic value 1. The AND gate 615 thus provides a replica of the output signal So. Therefore, while the output signal So is at the logic value 0, the flip-flop 620 remains reset, with its main output (and thus also the comparison signal Ph) at the logical value 0.

As soon as the signal So switches to the logic value 1 (before the subsequent rising edge of the clock signal Ck), the flip-flop 620 is set, so that its main output (and thus also the comparison signal Ph) takes the logic value 1. In this condition, at a subsequent rising edge of the clock signal Ck the corresponding pulse at the logic value 1 of the signal Bc resets the flip-flop 610, so that its main output takes the logic value 0. The AND gate 615 thus always provides the logic value 0, so that the condition of the flip-flop 620 (and thus the logic value of the comparison signal Ph) remains unchanged.

The FIG. 6C illustrates a final period of the trimming process, in which the total delay Dt exceeds the period T of the clock signal Ck.

In this condition, the signal Bc switches to the logic value 1 before the switching of the output signal So to the logic value 1. Therefore, the flip-flop 610 is reset and its main output takes the logic value 0. The AND gate 615 thus always provides the logic value 0 (regardless of the logic value of the output signal So), so that the flip-flop 620 is reset with its main output (and thus also the comparison signal Ph) at the logic value 0. In this condition, even when the output signal So switches to the logic value 1 the AND gate 615 continues to provide the logic value 0, so that the condition of the flip-flop 620 (and thus the logic value of the comparison signal Ph) remains unchanged.

Naturally, in order to satisfy local and specific requirements, a person skilled in the art may apply to an embodiment described above many logical and/or physical modifications and alterations. More specifically, although one or more embodiments have been described with a certain degree of particularity, it is understood that various omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment may be incorporated in any other embodiment as a matter of general design choice.

For example, an embodiment lends itself to be implemented with an equivalent method (by using similar steps, removing some non-essential steps, or adding further optional steps); furthermore, the steps may be performed in a different order, in parallel or overlapped (at least partly). In addition, the input signal may be obtained differently (so as to be synchronous with the clock signal); similarly, the delay line may be programmed and/or trimmed in an equivalent manner.

Moreover, the target value of the total delay may be selected in different ways (for example, outside the integrated device by a user and/or another integrated device).

The number of delay modules and the value of the corresponding unitary delay are purely indicative. Furthermore, the delay modules may be disabled in some other way (for example, each one through a corresponding switch that short-circuits it individually); in any case, it is possible to provide a different number of delay modules that may be disabled (up to all). In any case, an embodiment lends itself to be used in a delay line with a different structure (even with a single module).

Although in this description explicit reference has been made to a delay line with delay modules being all equal to each other, this is not to be interpreted in a limitative manner; for example, it may be possible to have different delay modules that contribute linearly to the total delay (for example, with some modules that provide a partial delay double that provided by other modules).

Similar considerations apply if the trimming of the delay line is made by using two or more periods of the clock signal, or more generally any other reference signal (sufficiently precise).

The variation of the total delay during the programming procedure may be performed in some other way (for example, in steps of any amplitude).

In any case, the total delay may be varied with other techniques to match the period of the clock signal. For example, in an alternative embodiment, it is possible to use a dichotomic technique, in which the trimming process starts from a total delay greater than the period of the clock signal, which is continuously divided by half until it is reached the period of the clock signal with the desired precision. In a further embodiment, the trimming process starts again from a total delay greater than the period of the clock signal, which is now continuously decreased until falling down the period of the clock signal.

Embodiments of the detector described above are merely illustrative (with the same result that may be obtained with any other circuit capable of comparing the total delay of the output signal of the delay line with the period of the clock signal). The delay line may include a different number of programmable delay modules (down to only one—for example, the first fixed module); in addition, the partial delay of each programmable delay module may be reduced in another way (even in steps of different amplitude that are a linear function of the unitary delay). More generally, the fine programming of the delay line may be implemented in other ways; for example, when the target value of the total delay may be set only to multiples of the fractional delay, the programming procedure is simplified accordingly. In any case, this feature is not strictly necessary, and an embodiment may also be applied in a delay line without any individually programmable delay module.

Alternatively, the trimming procedure may only be activated when the integrated device turns on, only periodically (with any other timing), or more generally in any other way (for example, at a first use of the delay line).

Similar considerations may apply if the integrated device has a different structure or includes equivalent components (either separated from each other or combined together, in whole or in part); in addition, the integrated device may have different operating characteristics. In particular, an embodiment may be used in any other integrated device (e.g., a processor), which includes any number of delay lines.

It is readily apparent that an embodiment may be part of the design of the same integrated device. The design may also be created in a programming language; in addition, if the designer does not manufacture the integrated device or its masks, the design may be transmitted through physical means to others. Anyway, the integrated device may be distributed by its manufacturer in the form of a raw wafer, as a naked chip, or in packages.

Moreover, an embodiment of an integrated device may be coupled with one or more other devices (such as a processor), or it may be mounted in intermediate products (such as motherboards). In any case, such an integrated device may be adapted to be used in complex systems (such as mobile phones).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method; comprising:
   trimming a programmable delay line in an integrated device, the delay line being adapted to delay an input signal being synchronous with a synchronization signal of the integrated device by a total delay, wherein the method includes the steps of:

preliminary programming the delay line to provide a selected nominal value of the total delay equal to a period of the input signal, and trimming the delay line to vary an actual value of the total delay until the actual value of the total delay matches the period of the synchronization signal.

2. The method according to claim 1, further including the step of:

operatively programming the delay line to provide the selected nominal value of the total delay equal to a target value being different of the period of the synchronization signal.

3. The method according to claim 1, wherein the delay line includes a plurality of delay modules each for providing a partial delay linearly contributing to the total delay according to a corresponding contribution factor, at least part of the delay modules being adapted to be disabled, wherein each step of programming the delay line includes enabling the delay modules being necessary to obtain the selected nominal value of the total delay, and wherein the step of trimming the delay line includes trimming the enabled delay modules uniformly.

4. The method according to claim 3, wherein all the delay modules are equal to each other for providing a same value of the corresponding partial delay.

5. The method according to claim 1, wherein the step of trimming the delay line includes:

repeatedly varying the actual value of the total delay until the actual value of the total delay matches the period of the synchronization signal.

6. The method according to claim 5, wherein the step of trimming the delay line further includes:

initializing the actual value of the total delay to an initial value being lower than the period of the synchronization signal, the step of repeatedly varying the actual value of the total delay including:

repeatedly increasing the actual value of the total delay until the actual value of the total delay exceeds the period of the synchronization signal.

7. The method according to claim 6, wherein the step of repeatedly increasing the actual value of the total delay includes:

deasserting a comparison signal in response to the delayed input signal, the deassertion being inhibited by an edge of the synchronization signal after a further edge of the synchronization signal corresponding to the input signal, and stopping the increasing of the actual value of the total delay in response to the comparison signal being asserted.

8. The method according to claim 3, wherein at least one delay module is programmable individually for linearly reducing the corresponding partial delay according to a reduction factor, each step of programming the delay line further including:

programming one of the delay modules being enabled for reducing the corresponding partial delay to approximate the selected nominal value of the total delay.

9. The method according to any claim 1, further including the step of:

triggering the execution of the steps of preliminary programming and trimming the delay line in response to a turn-on of the integrated device and/or periodically.

10. A circuit, comprising:

a delay line configured to generate an output signal having a delay relative to an input signal;

a detector configured to indicate whether the output signal has approximately a reference delay; and a controller configured to calibrate the delay line by causing the delay line to a have a reference configuration and by adjusting a parameter of the delay line so that the detector indicates that the output signal has approximately the reference delay.

11. The circuit of claim 10 wherein the delay line comprises a delay module configured to impart a fixed delay to the input signal.

12. The circuit of claim 10 wherein the delay line comprises a delay module configured to impart a programmable delay to the input signal.

13. The circuit of claim 10 wherein the delay line comprises a delay module configured to receive a programming signal and to impart to the input signal a delay that corresponds to the programming signal.

14. The circuit of claim 10 wherein the delay line comprises:

a delay module configured to receive a first programming signal and to impart to the input signal a delay that corresponds to the first programming signal; and a decoder configured to receive a second programming signal and to generate the first programming signal from the second programming signal.

15. The circuit of claim 10 wherein the delay line comprises:

a decoder configured to receive a first programming signal from the controller and to generate a second programming signal in response to the first programming signal; and a delay module configured to receive the second programming signal and to impart to the input signal a delay that corresponds to the second programming signal.

16. The circuit of claim 10 wherein the delay line comprises:

a first delay unit configured to impart the delay to a first type of edge of the input signal; and a second delay unit configured to impart the delay to a second type of edge of the input signal.

17. The circuit of claim 10 wherein the delay line comprises:

a first delay unit configured to impart the delay to a rising edge of the input signal; and a second delay unit configured to impart the delay to a falling edge of the input signal.

18. The circuit of claim 10 wherein the delay line comprises:

a delay node;

a capacitor selectively coupleable to the delay node, a value of the delay depending on whether the capacitor is coupled to the delay node; and a transistor coupled to the delay node and configured to discharge the capacitor with an adjustable discharge current while the capacitor is coupled to the delay node.

19. The circuit of claim 10 wherein the delay line comprises:

a delay node;

a capacitor selectively coupleable to the delay node, a value of the delay depending on whether the capacitor is coupled to the delay node; and a transistor coupled to the delay node and configured to discharge the capacitor with an adjustable discharge current while the capacitor is coupled to the delay node, the discharge current being the parameter.

20. The circuit of claim 10 wherein the detector is configured to indicate whether the output signal has approximately the reference delay by generating an indicator signal having a first value in response to the output signal having approximately the reference delay.

21. The circuit of claim 10 wherein the detector is configured to indicate whether the output signal has approximately the reference delay by generating an indicator signal having a first value in response to the output signal having a delay that is less than the reference delay and having a second value in response to the output signal having a delay that is more than the reference delay.

22. The circuit of claim 10 wherein:
the detector is configured to receive a reference signal having a period; and
wherein the reference delay is related to the period of the reference signal.

23. The circuit of claim 10 wherein:
the detector is configured to receive a reference signal having a period; and
wherein the reference delay is approximately equal to the period of the reference signal.

24. The circuit of claim 10 wherein the controller is configured to program the delay that is imparted to the input signal.

25. The circuit of claim 10 wherein the controller is configured to cause the delay line to have the reference configuration by programming the delay line to enable a number of delay modules corresponding to the reference delay.

26. The circuit of claim 10 wherein the controller is configured to cause the delay line to have the reference configuration with a programming signal.

27. The circuit of claim 10 wherein the controller is configured to adjust the parameter of the delay line with a calibration signal.

28. The circuit of claim 10 wherein the controller is configured to incrementally adjust the parameter of the delay line until the detector indicates that the output signal has approximately the reference delay.

29. The circuit of claim 10, further comprising a generator configured to generate the input signal from a clock signal.

30. The circuit of claim 10, further comprising:
a generator configured to generate the input signal from a clock signal having a period; and
wherein the reference delay is related to the period of the clock signal.

31. The circuit of claim 10, further comprising:
a generator configured to generate the input signal from a clock signal having a period;
wherein the detector receives the clock signal; and
wherein reference delay is related to the period of the clock signal.

32. A system, comprising:
a first integrated circuit, comprising:
a delay line configured to generate an output signal having a delay relative to an input signal;
a detector configured to indicate whether the output signal has reached a reference delay; and
a controller configured to calibrate the delay line by causing the delay line to have a reference configuration and by adjusting a parameter of the delay line so that the detector indicates that the output signal has approximately the reference delay; and
a second integrated circuit coupled to the first integrated circuit.

33. The system of claim 32 wherein the first and second integrated circuits are disposed on a same integrated-circuit die.

34. The system of claim 32 wherein the first and second integrated circuits are disposed on respective integrated-circuit dies.

35. The system of claim 32 wherein one of the first and second integrated circuits comprises a processor.

36. A method, comprising:
configuring a circuit to impart to a signal a first delay that is lower than a calibration delay; and
incrementally adjusting the circuit until the first delay is approximately equal to the calibration delay.

37. The method of claim 36 wherein configuring the circuit comprises enabling a number of delay modules, the number corresponding to the calibration delay.

38. The method of claim 36 wherein incrementally adjusting comprises incrementally adjusting the circuit to increase the delay.

39. The method of claim 36 wherein incrementally adjusting comprises incrementally adjusting the circuit to decrease the delay.

40. The method of claim 36, further comprising causing the circuit to impart a second delay to the signal after the first delay is approximately equal to the calibration delay.

41. The method of claim 36 wherein incrementally adjusting comprises incrementally adjusting a capacitor discharge current of the circuit.

42. A system, comprising:
a first integrated circuit, comprising:
a delay line configured to generate an output signal having a delay relative to an input signal;
a detector configured to indicate whether the output signal has approximately a reference delay; and
a controller configured to calibrate the delay line by causing the delay line to have a reference configuration and by adjusting a parameter of the delay line so that the detector indicates that the output signal has approximately the reference delay; and
a second integrated circuit coupled to the first integrated circuit.

43. A method, comprising:
configuring a circuit to impart to a signal a first delay that is approximately equal to a calibration delay; and
incrementally adjusting the circuit until the first delay is approximately equal to the calibration delay.

* * * * *